United States Patent
Kovacs et al.

[11] Patent Number: 5,631,918
[45] Date of Patent: May 20, 1997

[54] LASER DIODE ARRAYS WITH CLOSE BEAM OFFSETS

[75] Inventors: Gregory J. Kovacs, Sunnyvale; Rose M. Donaldson, Santa Clara; Harlan F. Chung, Castro Valley; William J. Mosby, San Jose; Eva E. Taggart, Saratoga; Thomas L. Paoli, Los Altos, all of Calif.

[73] Assignee: Xerox Corporation, Stamford, Conn.

[21] Appl. No.: 156,222

[22] Filed: Nov. 22, 1993

[51] Int. Cl.[6] .................................... H01S 3/02
[52] U.S. Cl. ........................ 372/36; 372/50; 372/109
[58] Field of Search ........................ 372/36, 50, 109

[56] References Cited

U.S. PATENT DOCUMENTS

| | | | |
|---|---|---|---|
| 3,568,087 | 3/1971 | Phelan, Jr. et al. | 372/36 |
| 4,832,251 | 5/1989 | Hawrylo | 288/105 |
| 5,036,521 | 7/1991 | Hatakoshi et al. | 372/46 |
| 5,173,759 | 12/1992 | Murano | 257/88 |
| 5,357,536 | 10/1994 | Andrews | 372/50 |

FOREIGN PATENT DOCUMENTS

| | | |
|---|---|---|
| 57-178393 | 11/1982 | Japan . |
| 61-102787 | 5/1986 | Japan . |
| 61-194789 | 8/1986 | Japan . |
| 61-218186 | 9/1986 | Japan . |
| 1209578 | 8/1989 | Japan . |

Primary Examiner—James W. Davie

[57] ABSTRACT

The present invention concerns laser diode arrays having an accurately spaced offset in the laser beams emanating from their respective laser stripes, and methods of their manufacture. The first method involves the mounting of at least two laser diodes on a submount such that the axes of the laser stripes between the two respective diodes are accurately spaced. The second method concerns the placement of a position mark on each diode at a accurate distance from the axis of the laser stripe such that the mark is easily detectable from a side view. The two diodes are then mounted with the axes of their laser stripes accurately spaced from the relative positioning of the position marks. The third method concerns the manufacture of laser diodes whose laser stripe axes are accurately spaced from at least one side edge of the diodes. The array of diodes is constructed such that the laser stripe axes are accurately spaced from each other relative to the side edges of accurate distance from their respective axes.

13 Claims, 6 Drawing Sheets

LASER DIODE ARRAYS WITH CLOSE BEAM OFFSETS

FIELD OF THE INVENTION

The present invention relates generally to laser diode arrays and particularly to laser diode arrays with close beam offsets.

BACKGROUND OF THE INVENTION

Xerographic printing has evolved along the lines of higher throughput and increasing print quality. Current attempts at increasing throughput have focused on the use of multiple laser beams to concurrently image a photoreceptor surface. The throughput of a xerographic printing system is usually proportional to the number of independently addressable beams imaging the surface.

One known way of achieving high throughput is by using arrays of laser diodes. Multiple, independently addressable diodes allow for parallel writing to a photoreceptor; thereby increasing throughput. While multiple laser beams promise higher throughput, their use does not necessarily guarantee better print quality.

Improved print quality has generally been a function of resolution which, in turn, depends upon spot size and the accurate spacing of spots. As a general rule, a smaller spot size allows higher resolution. Likewise, the resolution is increased the closer and more accurately the spots can be spaced.

Typically, the spacing of beams generally takes place in two orthogonal axes: tangential and sagittal. The tangential plane in a raster output scanner (ROS) system is generally the top view as seen from the axis of rotation of the mirrored polygon. The sagittal view is generally the side view as seen from a single mirrored facet of the polygon. A good discussion of the tangential and sagittal planes is found in "Laser Scanning for Electronic Printing" by Urbach et al. as published in the Proceedings of the IEEE, Vol. 70, No. 6, June 1982, which is herein incorporated by reference.

Laser diode arrays are generally of two different varieties: monolithic and nonmonolithic. Monolithic arrays of laser diodes are arrays of laser stripes (i.e. layers of materials that laser when an electric current runs through them) that are produced as a unitary structure in the manufacturing process. By contrast, nonmonolithic arrays are structures that are not constructed as unitary arrays. Instead, a nonmonolithic array usually comprises a separate submount and a plurality of laser diodes that are coupled to the submount in some fashion such as solder, epoxy, or the like.

For nonmonolithic arrays of laser diodes, accurate spacing along the tangential axis can be controlled by the precise construction of a submount on which the laser diodes are coupled. The construction and structure of such submount units are described in greater detail in commonly assigned U.S. Patent Application Number (as yet unassigned), entitled "Nonmonolithic Arrays of Accurately Positioned Diode Lasers", filed on (as yet to be filed) by Biegelsen et al. (Attorney Docket Number D/93080) which is herein incorporated by reference. Accurate tangential spacing can eliminate the registration error of two beams writing across the same scan line, as is desirable in color xerography.

For monolithic arrays, accurate spacing along the tangential axis can be controlled by the present techniques of semiconductor fabrication such as epitaxial deposition, photolithography, ion implantation, and the like. It will be appreciated that these techniques are very well known in the art.

Accurate spacing of beams in the sagittal direction is perhaps even more important to the human eye. Errors in the sagittal plane show up as uneven spacing between adjacent scan lines. These errors are generally noticeable to the naked eye; and, consequently, decrease the perceived print quality.

Thus, there is a need to accurately control the spacing between laser diode beams in the sagittal plane to improve print quality.

It is therefore an object of the present invention to provide several methods for controlling the spacing of laser diode beams along the sagittal axis.

SUMMARY OF THE INVENTION

In summary, the present invention encompasses both articles of manufacture and methods for their manufacture. The articles comprise laser diode arrays having an accurately spaced offset in the laser beams emanating from their respective laser stripes. The methods of the present invention involve the creation of these presently claimed articles of manufacture. The first method involves the mounting of a first laser diode on the submount. The laser stripe of the first diode may be located and accurately positioned. This positioning could be accomplished by setting the crosshairs of a microscope, micrometer, or some other suitable scope. Once positioned, a known sagittal offset is created. This offset may be created by moving the crosshairs of the microscope (or some positioning means in a suitable scope) a known distance in the sagittal direction. The second diode is mounted on the submount such that the axis of its laser stripe rests upon the positioning means.

The second method improves upon the first method by etching grooves, or otherwise making a mark, at known distances from the axes of the laser stripes. The positioning steps of the first method are then applied to the grooves or marks, as opposed to the axes of the laser stripes. Aligning the distances from the grooves is desirable because the distances of the grooves from the axes of the respective stripes can be accurately maintained and because the grooves are generally easier to sight visually on the edge than laser stripes.

The third method of accurately offsetting laser diodes involves the precise cleaving of the diodes such that the axes of the laser stripes are at known distances away from a side edges of the diodes, within very accurate tolerances. The diodes are then mounted and positioned such that their edges are at a specified offset from each other.

A companion method for producing laser diodes with precise cleaving is also disclosed. A wafer having laser stripes formed on its surface is cleaved within a known distance from the stripe. The cleaving is accomplished by making a mark on the surface where the cleave is desired and then slightly applying pressure on the substrate so that the cleave will propagate from the mark along the cleave plane indicated by the crystal orientation. After this first cleaving, a single bar containing the laser stripe is created. A second cleaving, started at the opposite side of the bar from the laser stripe, defines the length of the laser cavity (i.e. the length through which the lasing light propagates within the diode) and a single laser diode is thus formed.

One advantage of the present invention is improved print quality. The accurate sagittal spacing of laser diodes insures that adjacent scan lines are within a high degree of tolerance. This spacing nearly eliminates any defect in scan line spacing visible to the unaided eye.

Additional objects and features of the present invention will be more readily apparent from the following detailed

3 description of an exemplary embodiment thereof, as illustrated in the accompanying drawings.

BRIEF DESCRIPTION OF THE DRAWINGS

The purpose and advantages of the present invention will be apparent to those skilled in the art from the following detailed description in conjunction with the drawings.

FIG. 2 depicts the structure as made by the steps of a first method of obtaining sagittal offset.

DETAILED DESCRIPTION OF THE PREFERRED EMBODIMENTS

The following description is presented to enable any person skilled in the art to make and use the invention, and is provided in the context of a particular application and its requirements. Various modifications to the preferred embodiment will be readily apparent to those skilled in the art, and the generic principles defined herein may be applied to other embodiments and applications without departing from the spirit and scope of the present invention as defined by the appended claims. Thus, the present invention is not intended to be limited to the embodiment shown, but is to be accorded the widest scope consistent with the principles and features disclosed herein.

Figure 1:
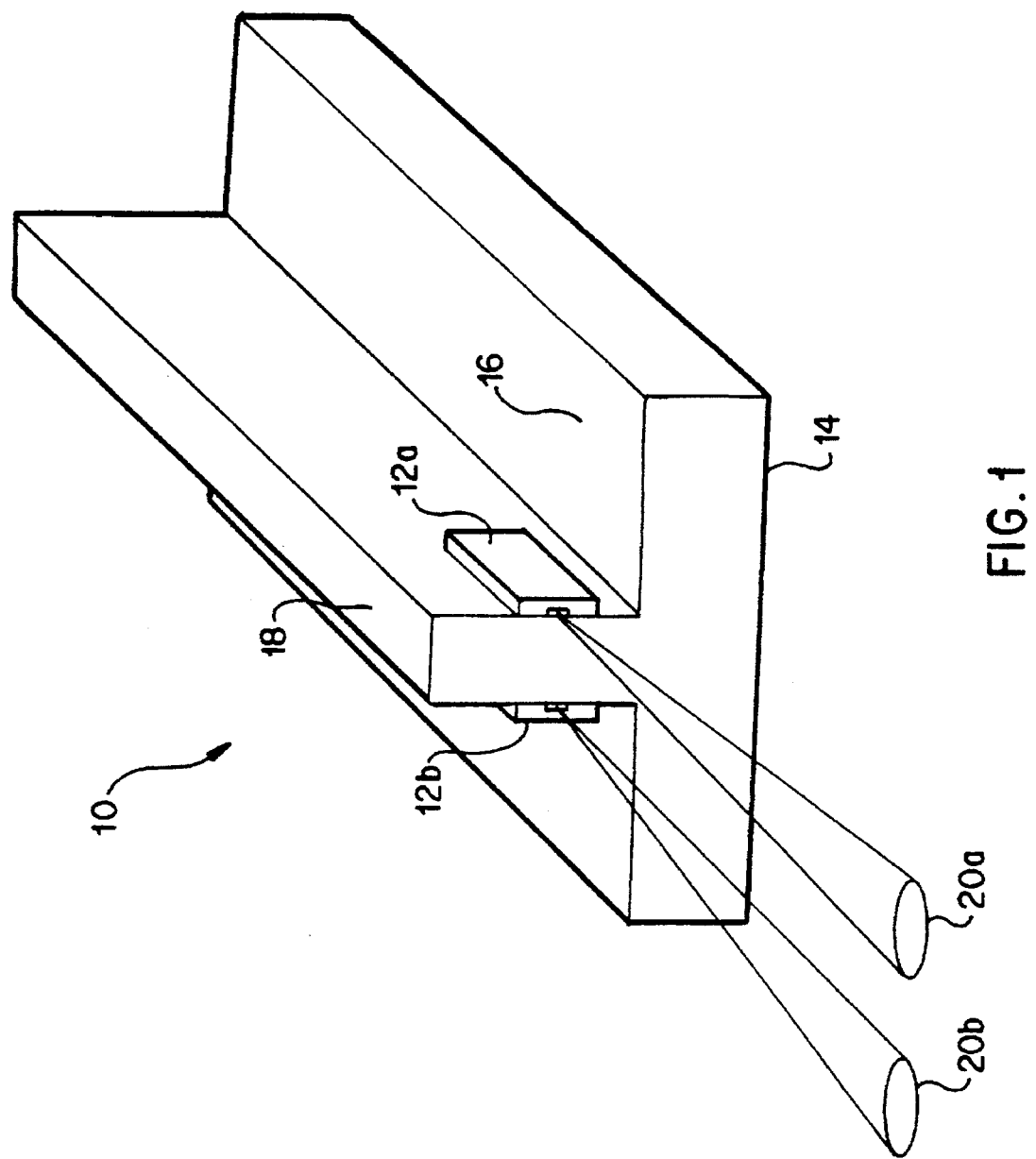
FIG. 1 is a perspective view of one embodiment of an array of laser diodes using a presently preferred submount.

Referring to FIG. 1, one embodiment of an array of laser diodes is shown, as disclosed in the above-incorporated Biegelsen et al. application. The array comprises a submount 14 and laser diodes 12a and 12b coupled to the submount. The submount 14 further comprises a base 16 and a bar 18 on which the laser diodes are coupled. The diodes 12a and 12b are shown mounted on bar 18 "p-side down" (i.e. with their laser stripes proximate to the mounting surfaces). Light beams 20a and 20b are shown emanating from the laser stripes of diodes 12a and 12b respectively. It will be appreciated that the structure shown in FIG. 1 is only illustrative of one type of array structure and that the methods of the present invention should not be limited to the particular embodiment disclosed herein. In fact, the methods of the present invention work for any array structure where the diodes may be precisely mounted on any submount structure.

Figure 2:
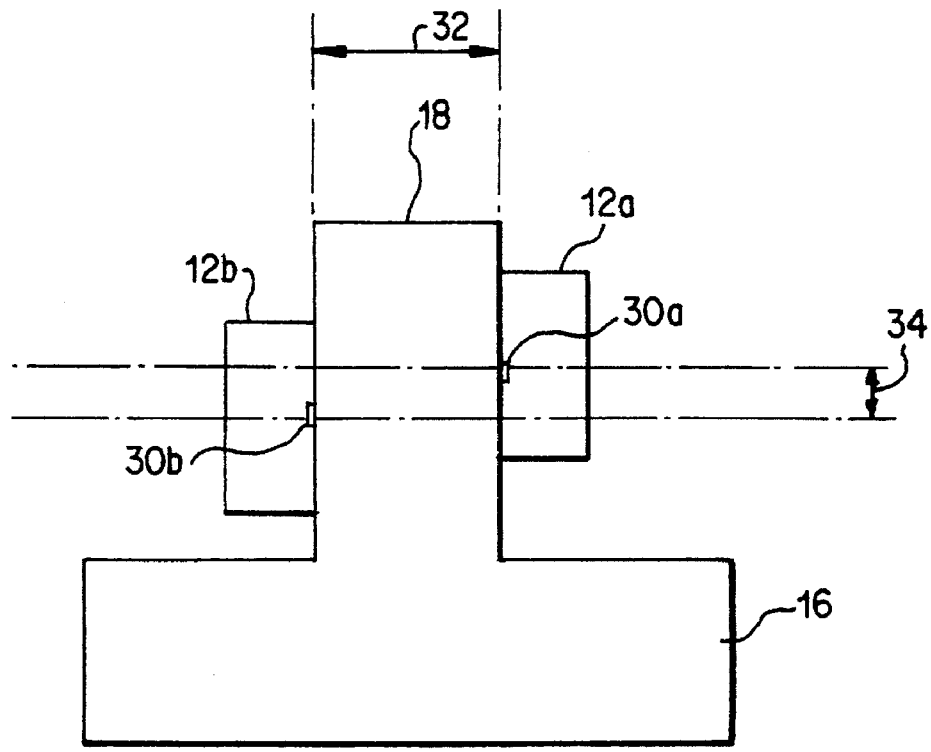
FIG. 2 is a front view of an array structure with a desired sagittal offset between the laser stripes of the diodes.

The first method of the present invention will now be described in reference to FIG. 2. FIG. 2 is a front view of the structure disclosed in FIG. 1 with the appropriate sagittal offset in the diodes. The first step in the process of creating this structure is to place a first diode, say 12a, p-side down on the bar 18 and solder or otherwise affix to the bar. Because of the extremely small size of the individual diodes, the diodes can be held in place with the aid of a vacuum collet. With a microscope, micrometer, or some such similar imaging scope, the axis of the laser stripe 30a is located and its position marked with the crosshairs (or some such positioning marker) of the scope. The crosshairs are then relatively displaced by some desired offset 34 in the sagittal plane. It will be appreciated that this relative displacement could be accomplished by either moving the crosshairs relative to a stationary diode or the diode could be moved relative to stationary crosshairs. The second diode 12b is then brought into place and the axis of its laser stripe is aligned with the crosshairs. With the diode 12b thus held in place, the diode is affixed to the bar 18. Distance 34 denotes the final and desired sagittal offset of the two diodes. Distances 32 denotes the final tangential offset.

Although the distance 32 is depicted as the tangential offset and distance 34 is depicted as the sagittal offset, it should be appreciated that either distance (or a component of such distance) could be made to produce an offset in either the tangential or sagittal plane merely by rotating the submount about the optical axis. For the purposes of exposition of the present invention, it will be assumed that the structures depicted in the Figures are aligned so that distance 32 defines the offset in the tangential plane while distance 34 defines the offset in the sagittal plane.

Figure 3:
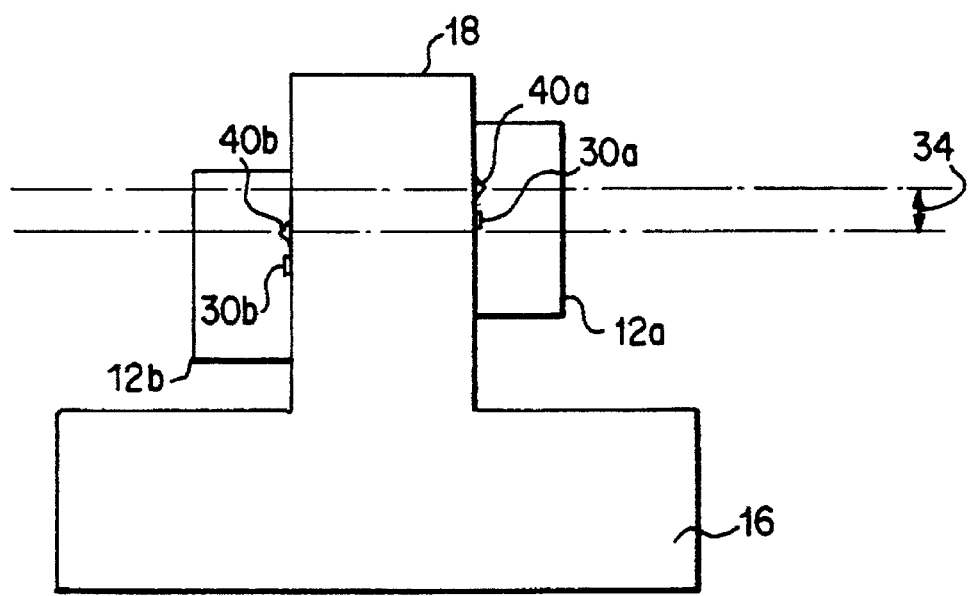
FIG. 3 is a front view of an array structure with desired sagittal offset obtained by a second claimed method.

It will be appreciated that the first method assumes that the laser stripes of the diodes are visible in a front view of the diode. If, however, the laser stripes cannot be accurately viewed from the front view, a second method of the present invention may be employed. FIG. 3 depicts an array structure that has grooves 40a and 40b etched onto the surface of the diodes at a precise distance away from the laser stripes. These grooves act as visible position marks, accurately spaced from the laser stripes. It will be appreciated that etching a groove a known distance from the laser stripe is well known to those skilled in the methods of semiconductor processing. Additionally, it will be appreciated that this distance can be accurately maintained to within the tolerances of current photolithographic methods. As an alternative embodiment, the position marks could be scribe marks instead of etched grooves.

The second method for producing the sagittal offset in FIG. 3 is similar to the first method—the only difference is that the first diode is laid down and the offset determined from the etched grooves instead of the axes of the laser stripes. Because the etched groove will be, in general, easier to spot from the front edge view, this second method should be easier to apply than the first method.

Figure 4:
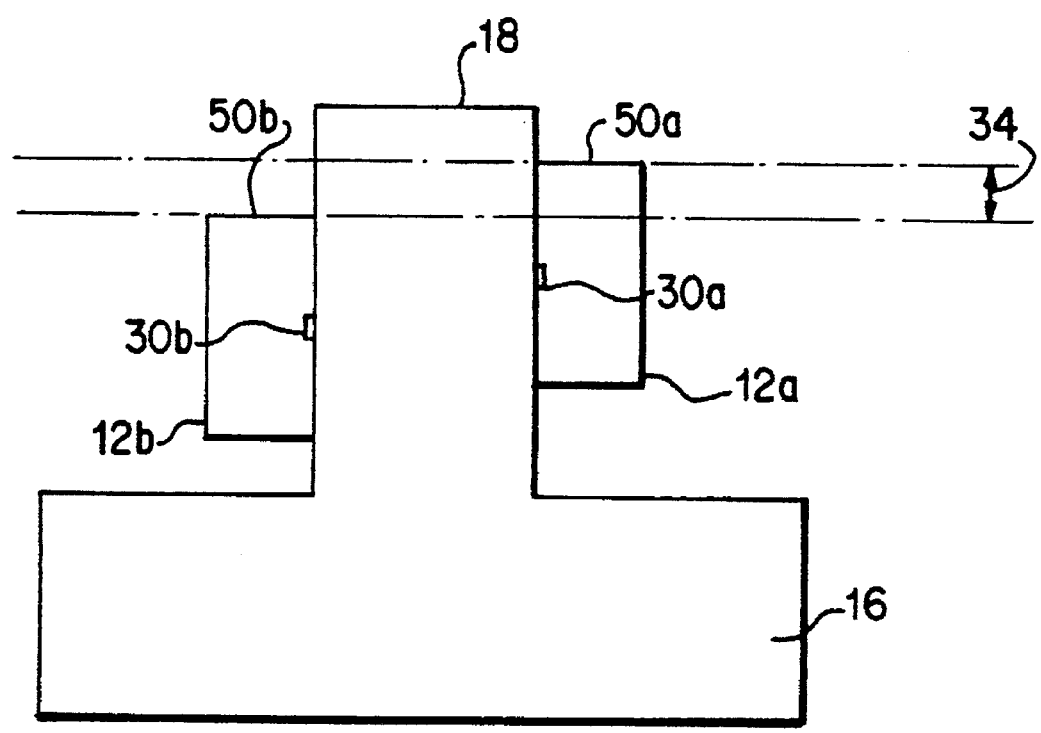
FIG. 4 is a front view of an array structure with desired sagittal offset obtained by a third claimed method.

The resulting structure from the third claimed method is shown in FIG. 4. The diodes in FIG. 4 are set at a desired sagittal offset as measured by the distance 34 defined by the side edges 50a and 50b of the diodes. In order for the sagittal offset to be accurate, the distance between the axes of the laser stripes and the side edges must be precise. The method for producing laser diodes with accurate distancing between the laser stripe and the side edge is depicted in FIGS. 5A–5E.

Figure 5A:
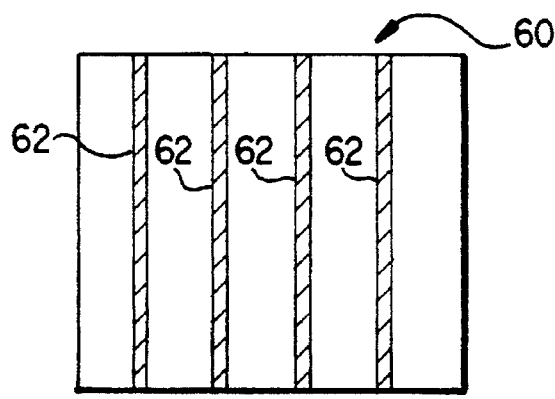
FIG. 5A–5E depicts the steps of processing a wafer of laser diodes that leave the laser stripe of the diode very accurately spaced from the side edge of the diode.
Figure 5B:
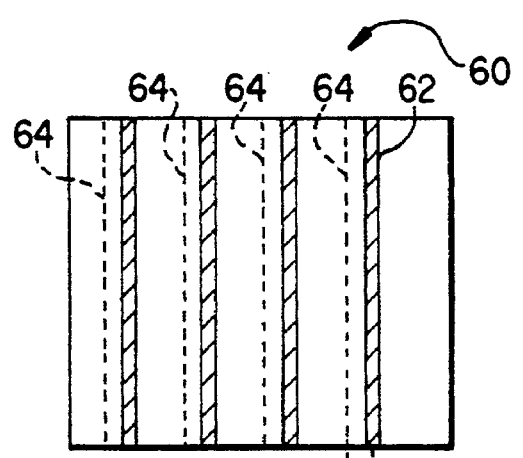
Figure 5C:
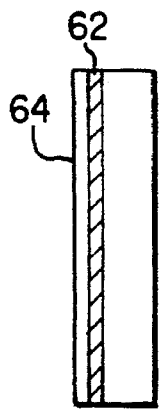

FIG. 5A shows a wafer 60 of laser stripes 62 that are constructed by well known semiconductor fabrication techniques. Each stripe has an axis that defines the direction of the laser cavity in the finished laser diode. The first step, as shown in FIG. 5B, is to align the crosshairs of a microscope to the axis of stripe and move the scribe to an offset of some desired distance 66 (approximately 5 µm in the presently preferred embodiment). With the scribe in position, a short scribe mark is made at the edge of the substrate or at some other point along the stripe. Once the initial mark has been made, slight pressure at the mark will induce a cleave break 64 in the crystalline substrate that will maintain the proper distance 66 parallel to the axis of the laser stripe 62 to within atomic tolerances. This cleaving step should be repeated for the many stripes on the substrate, producing several bars such as depicted in FIG. 5C. At such close proximity, the initial scribe marks may damage the stripe but the cleave break should not since the cleave should remain confined to a very narrow range of parallel atomic planes. Therefore, any possible damage to the lasing stripe is confined to the vicinity of the initial scribe marks.

Figure 5D:
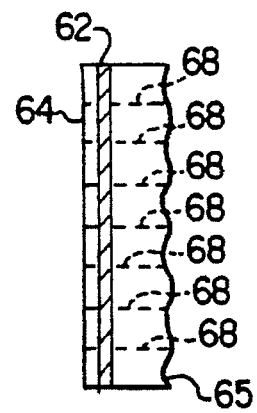
Figure 5E:
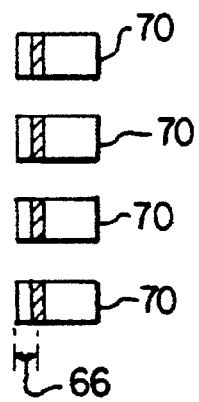

Given a bar such as in FIG. 5C, another set of cleaves are made to produce individual laser diodes, as depicted in FIG. 5D. At edge 65 of the bar, an accurately controlled scribing tool is aligned to a desired length for the laser diode's cavity and a scribe mark is made. As described before, slight pressure at this scribe mark will induce a cleave break that will result in the desired laser cavity length. This cleave step should be performed for as many times as necessary to produce a set of individual laser diodes 70, as shown in FIG. 5E. It will be appreciated that diodes 70 are constructed such that the distance 66 between edge 64 and the axis of the stripe 62 is within accurate tolerances—as required to create the final array structure shown in FIG. 4.

It will be appreciated that, although cleaving in general is well known in the art, the usual method of cleaving laser diodes is to first cleave transversely across the laser stripe to define the length of the laser cavity then cleave in the direction parallel to the laser stripe. The reasons for cleaving the length of the laser cavity first are two-fold: first, this cleave typically leaves a very planar facet mirror, and second, this first cleave exposes several facet mirrors along the resulting bar; thus, the coating of the facet mirrors may be mass produced along the entire bar.

It will be appreciated that all of the above mentioned methods employ some form of visual feature to accurately space pairs of laser diodes. Such visual features include the laser stripe, etched grooves, scribe marks, accurately cleaved edges, and the like. Further, it will be appreciated that various other visual marks will be apparent to those skilled in the art and that the present invention should not be limited to those feature listed here. Additionally, methods of using other detectable features, not necessarily visual, are also readily apparent to those skilled in the art. For example, various dyes or introduced impurities having a localizable property (e.g. electrical field, magnetic field, radioactive discharge, or some other type of effect) that may be accurately located by means other than visual, may also be employed.

Figure 6:
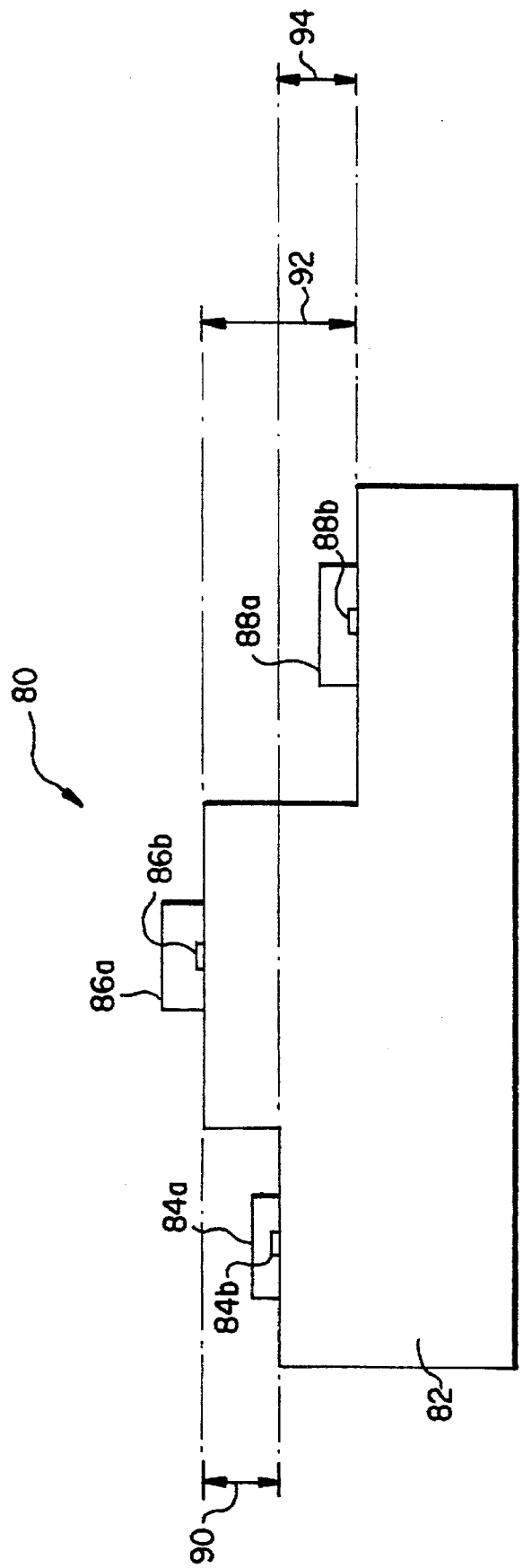
FIG. 6 is a front view of an alternative laser diode structure made in accordance with the principles of the present invention. The structure has accurately spaced steps formed into the base. Laser diodes are then mounted on these accurately spaced steps.

An alternative structure for laser arrays with close beam spacing is shown in FIG. 6. FIG. 6 is a side view of the alternative structure 80. Structure 80 comprises a submount 82 and laser diodes 84a, 86a, and 88a with laser stripes 84b, 86b, and 88b respectively. Distances 90, 92, and 94 define the offsets of all possible pairs of laser diodes in FIG. 6. Structure 80 further comprises submount 82 with the various steps of differing, accurately spaced heights made by machining or semiconductor fabrication techniques such as deposition, etching, photolithography or the like. Individual laser diodes may either be mounted on these steps or integrally formed by known fabrication techniques.

Figure 7:
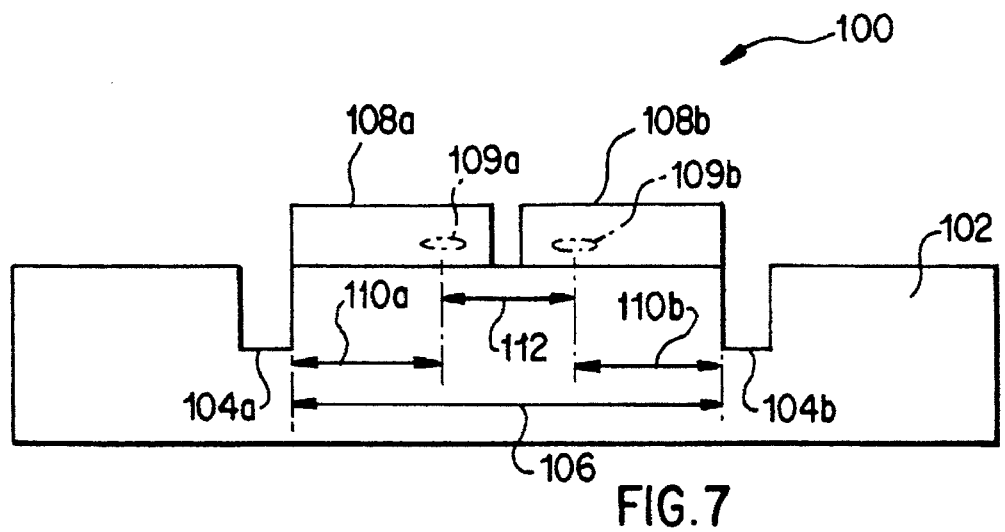
FIG. 7 is another embodiment of the present invention. The accurate spacing between the laser stripes is maintained in the direction of the surface of the submount base by use of visible features on the surface of the base and on the laser diodes.

Yet another alternative embodiment made in accordance with the principles of the present invention is shown in FIG. 7. The array 100 in FIG. 7 comprises a substrate 102 having grooves 104a and 104b etched into the substrate 102 at an accurate spacing 106. It will be appreciated that the accurate etching could be accomplished by current photolithographic techniques. On top of the substrate, laser diodes 108a and 108b are mounted such that one of their edges is aligned with the etched grooves respectively. Laser diodes 108a and 108b are such that the distances 110a and 110b between their aligned edges and their respective axes of stripes 109a and 109b are accurately distanced. It will be appreciated that this accurate distancing could be accomplished by the presently claimed cleaving method, as explained in conjunction with FIG. 5. Because distance 106 and distances 110a and 110b are accurately spaced, the distance 112 between the axes of the two respective stripes is accurately spaced.

Figure 8:
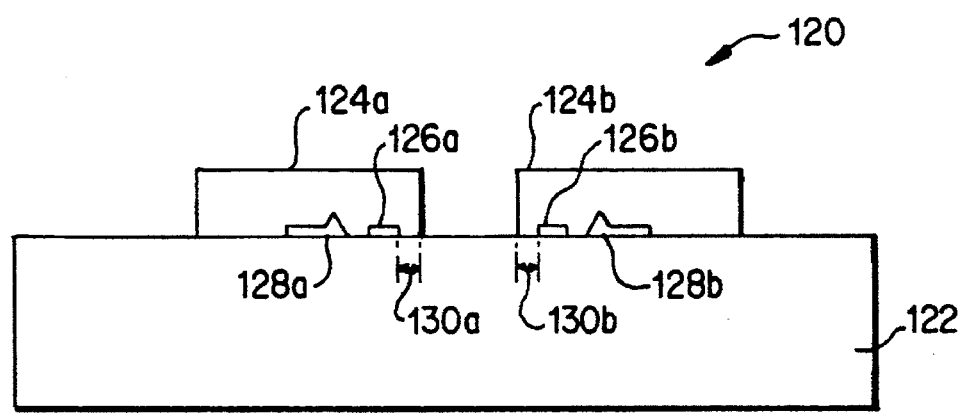
FIG. 8 is yet another embodiment of the present invention. The accurate spacing between the laser stripes is maintained in the direction of the surface of the submount base by use of a visible features on the laser diodes.

Still another embodiment of the present invention is shown in FIG. 8. Structure 120 comprises a submount base 122 and laser diodes 124a and 124b having laser stripes 126a and 126b respectively. Structure 120 may be constructed using any of the previously disclosed methods of construction. For example, structure 120 could have been constructed by mounting a first diode on the submount and then aligning the axis of the laser stripe of the second diode to an accurately spaced position (using a suitable scope or the like). Alternatively, notches 128a and 128b could have been formed (either by etch or scribe) and accurately spaced from the respective axes of laser stripes 126a and 126b. The subsequent mounting of the diodes could have been done in reference to the notches instead of the axes of the laser stripes directly. Lastly, the diodes 124a and 124b could have been cleaved so that distances 130a and 130b are accurately spaced. Mounting of the diodes, in that case, could have been accomplished in reference to the cleaved edges instead of the stripe axes. It will be appreciated that the offset created in FIG. 8 is made accurately spaced on the submount base surface. By contrast, the offsets created in FIGS. 2 through 4 are made accurately spaced in a direction outward from the surface of base 16.

Figure 9:
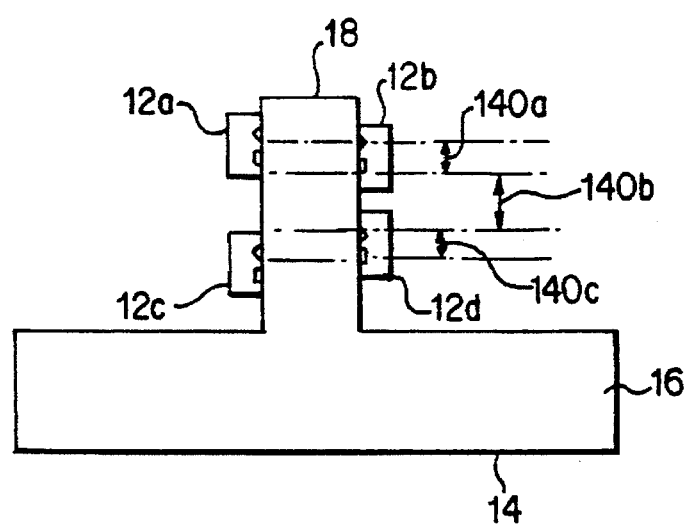
FIG. 9 is yet another embodiment of the present invention. The array shown has more than two diodes such that the offset between pairs of laser diodes is accurately spaced in accordance with the principles of the present invention.

It will be appreciated that although the presently preferred embodiments and the figures disclose arrays comprising only two or three laser diodes, the methods of the present invention can be suitably employed to produce arrays of an arbitrary number of laser diodes. FIG. 9 is yet another embodiment showing an array having more than two laser diodes made in accordance with the principles of the present invention. The offsets between any two laser stripes in the array are accurately spaced using the techniques previously described. For example, offsets 140a, 140b, and 140c are accurately spaced.

In summary, arrays of laser diodes having close beam spacing have been shown made in accordance with the principles of the present invention. The methods of producing arrays of laser diodes having known sagittal offsets have been described. A separate method for producing laser diodes with accurate distance between one edge and the axis of the laser stripe has also been described.

What is claimed:

1. An array of laser diodes comprising:

a submount, having at least one substantially planar mounting surface; and a plurality of laser diodes, each said laser diode having a laser stripe and a detectable feature accurately positioned with respect to said laser stripe, and each said laser diode having a substantially planar mounting surface, wherein the substantially planar mounting surface of each said laser diode is mounted on at least one substantially planar mounting surface of said submount such that there is an accurate spacing between the detectable features of at least one pair of laser diodes.

2. The array as recited in claim 1 wherein said detectable feature is an etched groove.

3. The array as recited in claim 1 wherein said detectable feature is a side edge of the laser diode.

4. The array as recited in claim 1 wherein said detectable feature is a localized region of impurities.

5. The array as recited in claim 1, wherein said submount further comprises at least a second substantially planar mounting surface, which is substantially parallel with, and separated by a predetermined distance from said one substantially planar mounting surface of said submount, wherein the mounting surface of at least one of said plurality of laser diodes is mounted on said one planar mounting surface of said submount, and the mounting surface of at least one other of said plurality of laser diodes is mounted on said second mounting surface of said submount.

6. The array as recited in claim 5, wherein one of said mounting surfaces of said submount has a detectable feature, and one of said laser diodes is mounted on said mounting surfaces such that the detectable feature of said laser diode is aligned with the detectable feature of said submount.

7. An array of laser diodes as recited in claim 1 wherein said submount has a plurality of planar mounting surfaces arranged in a step-like manner, said planar mounting surfaces being substantially parallel to one another, being accurately spaced from one another in the direction normal to said mounting surfaces, and being offset from one another in a direction parallel to said mounting surfaces.

8. An array of laser diodes comprising:

a submount, having at least one substantially planar mounting surface; and a plurality of laser diodes, each said laser diode having a laser stripe and a detectable feature accurately spaced and offset from said laser stripe, and each said laser diode having a substantially planar mounting surface, wherein the substantially planar mounting surface of each said laser diode is mounted on at least one substantially planar mounting surface of said submount such that there is an accurate spacing between the detectable features of at least one pair of laser diodes.

9. The array as recited in claim 8 wherein said detectable feature comprises an etched groove.

10. The array as recited in claim 8 wherein said detectable feature comprises a side edge of each said laser diode.

11. The array as recited in claim 8 wherein said detectable feature comprises a localized region of impurities.

12. An array of laser diodes comprising:

a submount, said submount having at least one substantially planar mounting surface and at least a first and a second detectable feature accurately spaced apart; and at least a first and a second laser diode, each said laser diode having a laser stripe and an edge accurately spaced and offset from the laser stripe, and each said laser diode having a substantially planar mounting surface, wherein the mounting surfaces of said first and second laser diodes are mounted to said at least one substantially planar mounting surface of said submount such that said edges of said first and second laser diodes are aligned with said first and second detectable features.

13. An array of laser diodes comprising:

a submount, having at least one substantially planar mounting surface; and a plurality of laser diodes, each said laser diode having a laser stripe and a substantially planar mounting surface, wherein the substantially planar mounting surface of each said laser diode is mounted on at least one substantially planar mounting surface of said submount such that there is an accurate spacing between the laser stripes of at least one pair of laser diodes.

* * * * *